(12) United States Patent
Nagasawa

(10) Patent No.: US 9,167,722 B2
(45) Date of Patent: Oct. 20, 2015

(54) ELECTRONIC DEVICE PROVIDED WITH SOCKET FOR CARD-SHAPED COMPONENT

(75) Inventor: Hideo Nagasawa, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 369 days.

(21) Appl. No.: 13/582,125

(22) PCT Filed: Mar. 2, 2011

(86) PCT No.: PCT/US2011/026850
§ 371 (c)(1),
(2), (4) Date: Nov. 13, 2012

(87) PCT Pub. No.: WO2011/109501
PCT Pub. Date: Sep. 9, 2011

(65) Prior Publication Data
US 2013/0194747 A1    Aug. 1, 2013

(30) Foreign Application Priority Data

Mar. 2, 2010 (JP) .................. 2010-045197

(51) Int. Cl.
*H05K 7/20* (2006.01)
*G06F 1/20* (2006.01)
*H01L 23/427* (2006.01)
*F28D 15/02* (2006.01)

(52) U.S. Cl.
CPC ........ *H05K 7/20336* (2013.01); *F28D 15/0275* (2013.01); *G06F 1/20* (2013.01); *H01L 23/427* (2013.01); *H01L 2924/0002* (2013.01)

(58) Field of Classification Search
USPC ........................ 361/679.46–679.54, 688–723
See application file for complete search history.

(56) References Cited

U.S. PATENT DOCUMENTS

| | | | | |
|---|---|---|---|---|
| 5,475,563 | A * | 12/1995 | Donahoe et al. | 361/695 |
| 5,721,463 | A * | 2/1998 | Snyder | 310/334 |
| 5,812,374 | A | 9/1998 | Shuff | |
| 6,278,609 | B1 * | 8/2001 | Suzuki et al. | 361/704 |
| 6,780,060 | B1 * | 8/2004 | Kajiura et al. | 439/620.21 |
| 6,781,846 | B1 * | 8/2004 | Suzuki et al. | 361/737 |
| 6,942,506 | B2 * | 9/2005 | Kimura et al. | 439/159 |
| 7,074,089 | B2 * | 7/2006 | Kajiura et al. | 439/620.01 |
| 7,090,519 | B2 * | 8/2006 | Muramatsu et al. | 439/159 |
| 7,133,285 | B2 * | 11/2006 | Nishimura | 361/715 |
| 7,286,346 | B2 * | 10/2007 | Chiba et al. | 361/679.48 |
| 7,336,485 | B2 * | 2/2008 | Leech et al. | 361/679.48 |
| 7,448,921 | B2 * | 11/2008 | Kim et al. | 439/744 |
| 7,518,870 | B2 * | 4/2009 | Choi et al. | 361/702 |

(Continued)

FOREIGN PATENT DOCUMENTS

| | | |
|---|---|---|
| EP | 1 684 561 A1 | 7/2006 |
| JP | 2005-222437 A | 8/2005 |
| JP | 2005-242946 A | 9/2005 |

OTHER PUBLICATIONS

International Search Report for PCT/US2011/026850.

*Primary Examiner* — Zachary M Pape

(57) ABSTRACT

The electronic device according to the Present Disclosure is an electronic device provided with a heat-dissipating portion and an electronic component socket that can accommodate, therein, an installable electronic component, wherein the electronic component socket has a thermal connecting portion for connecting thermally to the electronic component, and, when the electronic component is operating, the electronic component and the heat-dissipating portion are connected thermally through the thermal connecting portion.

19 Claims, 6 Drawing Sheets

(56) References Cited

U.S. PATENT DOCUMENTS

| | | | |
|---|---|---|---|
| 7,545,638 B2 * | 6/2009 | Aoto et al. | 439/487 |
| 7,667,972 B2 * | 2/2010 | Chen et al. | 361/709 |
| 2005/0088827 A1 | 4/2005 | Zhang | |
| 2006/0278380 A1 * | 12/2006 | Kang et al. | 165/148 |
| 2008/0080143 A1 | 4/2008 | Peng et al. | |
| 2009/0246993 A1 * | 10/2009 | Yu et al. | 439/159 |

* cited by examiner

ELECTRONIC DEVICE PROVIDED WITH SOCKET FOR CARD-SHAPED COMPONENT

REFERENCE TO RELATED APPLICATIONS

The Present Disclosure claims priority to prior-filed Japanese Patent Application No. 2010-045197, entitled "Electronic Device Provided With Socket For Card-Shaped Component," filed on 2 Mar. 2010 with the Japanese Patent Office. The disclosure of the aforementioned Patent Application is fully incorporated in its entirety herein.

BACKGROUND OF THE PRESENT DISCLOSURE

The Present Disclosure relates generally to a heat sink, a cooling module and a coolable electronic board that can cool various heat-generating bodies. More particularly, the Present Disclosures relates to a heat sink, a cooling module and a coolable electronic board that, by effectively decreasing the temperature gradient in the base without losing durability or reliability, reduces temperature increases in the heat-generating body (or, more specifically, increases the efficiency of cooling the heat-generating body).

The Present Disclosure relates to an electronic device able to not only attach an electronic component, primarily of a card shape, to the electronic device, but also, through connecting to the electronic component, to concentrate, within a device, and then dissipate effectively to the outside, heat that is generated within the device, through conveying, to a heat-dissipating portion that is provided within the electronic device, heat that is produced. Note that this "card shape" refers to a shape with specific outer dimensions and thickness, and can be installed easily into an electronic device, and includes a variety of shapes commonly understood to be "card-shaped."

A variety of electronic components that engender heat production are used in many electronic devices. In such electronic components, there is a variety of negative effects when the use environment becomes hotter than a specific temperature, such as the instability of normal operations, decreased reliability and the like, resulting in a performance reduction of the electronic device or manufacturing equipment itself. Technologies such as heat sinks and heat pipes have been developed and used long ago in order to suppress, through cooling, the heating from the electronic components. On the other hand, in portable electronic devices, there has been a need for a general specification for installing card-shaped electronic components in order to record video and audio data electronically, and to exchange with other equipment.

In recent years, there has additionally been an increase in the data transfer rate between electronic devices, memory cards and the like, accompanying increases in capacities of memories, improvements in writing and reading performance, improvements in the portable terminal performance and the like. Accordingly, there have been concerns that the amount of heat produced by the electronic components will get even larger, accompanying the increases in the amount of data transferred, resulting in instability in the operations of the devices.

Conventionally, there have been proposals for technologies wherein enclosures provided for card-shaped electronic components are mounted in the electronic devices and provided with heat-dissipating portions, so that when the card-shaped electronic component is inserted into a card case, the electronic component and the heat-dissipating portion make thermal contact, to dissipate, from the heat-dissipating portion, the heat that is produced by the card electronic component. Examples may be found in Japanese Patent Application No. 2005-222437; Japanese Patent Application No. 2005-242946; and Japanese Patent Application No. 2005-116564.

The '437 Application discloses a connector for a PC card wherein a movable frame is actuated when the PC card is inserted into the connector for the PC card, causing the PC card to make contact with the heat-dissipating portion that is provided in the connector for the PC card. The '946 Application discloses a technology wherein the inserted PC card makes contact with a heat-dissipating portion that is provided in the housing of a connector for the PC card. The '564 Application discloses a connector for a card having a structure wherein a heat-dissipating member that can rotate in order to promote the dissipation of heat of the inserted card is provided, where the rotation of the heat-dissipating member causes contact with the card when the card is inserted.

In the disclosures above, the connectors or sockets themselves, into which electronic components are installed, such as connectors for PC cards, are provided with the heat-dissipating portions. PC cards are often used in electronic devices that are used on a desk, such as, computers and the like. Card-shaped electronic components, such as PC cards having a relatively large size, such as PCMCIA-standard components, can be used in such electronic devices.

On the other hand, in conventional portable electronic devices, there are demands for even electronic components to be made smaller and thinner, because of the demands for making the electronic devices themselves smaller and thinner. In addition, due to the demands for higher speeds in exchange of data between electronic devices, and demands for higher capacities, there is a tendency for an increased number of terminals in the electronic devices. Sockets and connectors for the installation of small electronic devices that have a high number of terminals have extreme problems in terms of the provision, thereon, of heat-dissipating members provided with adequate surface area, as in the disclosures above. In addition, it is difficult to secure the space for mounting heat-dissipating members in such electronic devices.

On the other hand, in some electronic devices heat-dissipating members are often provided in advance in order to cool the heat that is produced by the processing device (for example, a central processing device ("CPU")) or the power supply portion that is included internally. For example, heat sinks, heat pipes, cooling fans, graphite sheets and the like are mounted within the electronic components. In such a situation, the heat from the installed electronic component, that has had to be made smaller and thinner, preferably is dissipated through these heat-dissipating members. However, in the conventional technology there has been a problem in that such heat dissipation has not been performed adequately due to the heat-dissipating portion being provided on the connector or socket itself.

SUMMARY OF THE PRESENT DISCLOSURE

Accordingly, and as described above, the conventional technology has had a problem in that the heat of the installable electronic component, which has an increased amount of heat production, has not been performed adequately in smaller, thinner electronic devices (and in the smaller, thinner sockets and connectors thereof). In consideration of the problem areas set forth above, an object of the Present Disclosure is to provide an electronic device, with advances in smallness and thinness, that not only makes electrical connections with the installed electronic component, but makes thermal connections as well to dissipate the heat efficiently.

In order to solve the problems set forth above, the electronic device according to the Present Disclosure is an electronic device having an electronic component socket that accommodates, therein, an installable electronic component, and has a heat-dissipating portion, wherein the electronic component socket has a thermal connecting portion for connecting thermally with an electronic component, and where, at the time of operation of the electronic component, the electronic component and the heat-dissipating portion are connected thermally through the thermal connecting portion.

The electronic device according to the Present Disclosure not only accommodates an installable electronic component, such as a memory card or a card-shaped electronic component, to make electrical connections, but also makes thermal connections between the electronic component and a heat-dissipating portion provided in the electronic device, and thus collects the heat within the device and performs thermal dissipation efficiently. Additionally, in the electronic component socket of the Present Disclosure, the socket itself does not require the provision of a heat-dissipating portion, and thus is optimal for a socket for accommodating an electronic component with advances in smallness and increased number of terminals. That is, the electronic component socket performs the electrical connections and the thermal connections to the electronic component and the transport of heat to the heat-dissipating portion all at once, based on the assumption of collecting and processing the heat dissipation to the outside within the electronic device. Because this function is fulfilled, there are no impediments to making the electronic device smaller and thinner, and there is little design overhead for the electronic device. Furthermore, a transporting member having a heat pipe function is used as the thermal connecting portion to functionally isolate between the thermal transport and the thermal dissipation, enabling faster transportation of the heat from the electronic component to the heat-dissipating portion, as the heat diffuses. The result is that the electronic component is cooled efficiently.

An electronic device according a first aspect of the Present Disclosure is provided with an electronic component socket that can accommodate therein an installable electronic component, and a heat-dissipating portion, wherein the electronic component socket has a thermal connecting portion for connecting thermally to the electronic component and, when, the electronic component is operating, the electronic component and the heat-dissipating portion are connected thermally through the thermal connecting portion. This structure enables the electronic component and the socket for the electronic component to dissipate heat produced by the electronic component through a heat-dissipating portion provided in the electronic device. That is, even for a small electronic component, on which it is difficult to mount a heat-dissipating portion, and for a socket, it is still possible to dissipate the heat produced by the electronic component through the use of the heat-dissipating portion provided in the electronic device.

In an electronic device according to a second aspect of the Present Disclosure, the thermal connecting portion has a heat-receiving member that receives heat generated by the electronic component, and a transporting member that transports, to the heat-dissipating portion, heat received by the heat-receiving member. This structure enables the thermal connecting portion to receive reliably the heat that is produced by the electronic component, and to transport the received heat reliably to the heat-dissipating portion.

In an electronic device according to a third aspect of the Present Disclosure, the socket for the electronic component includes an electrical pad for connecting electrically with a contact point provided on an end portion of the electronic component, and the heat-receiving member includes a thermally conducting pad that makes contact with the electrical pad and at least a portion of the surrounding of the electrical pad. This structure makes it possible for the electrical connecting portion and the thermal connecting portion to fulfill reliably their respective roles.

In an electronic device according to a fourth aspect of the Present Disclosure, the transporting member is connected thermally to the heat-dissipating portion, and has a recessed portion or a hole that mates with a raised portion provided on the heat-dissipating portion, a raised portion that mates with a recessed portion or hole that is provided in the heat-dissipating portion, a comb tooth-shaped member that mates with a comb tooth-shaped member that is provided in the heat-dissipating portion, and a plate member that makes surface contact with at least a portion of the heat-dissipating portion. This structure enables the transporting member to achieve a thermal connection reliably with the heat-dissipating portion, to enable the transporting member to transport the heat reliably to the heat-dissipating portion.

In an electronic device according to a fifth aspect of the Present Disclosure, the heat-receiving member receives heat from the electronic component through the electronic component being inserted into the electronic component socket, where the transporting member transports, to the heat-dissipating portion, heat from the heat-receiving member, and thus the heat connecting portion transports, to the heat-dissipating portion, heat that is produced by the inserted electronic component. This structure enables the electronic device to achieve both an electrical connection and a thermal connection between the electronic component and the electronic device.

In an electronic device according to a sixth aspect of the Present Disclosure, the transporting member includes an interior space into which a coolant can be sealed, a vapor diffusing space for diffusing vaporized coolant included within the interior space, a coolant return flow space for the return flow of a condensed coolant, included within the interior space, and an interference-preventing plate for preventing interference between the vaporized coolant that diffuses through the vapor diffusing space and the condensed coolant that flows back through the coolant return flow space. This structure enables the transporting member to transport heat at a high speed using a coolant. In particular, this reduces the interference between the diffusion of the vaporized coolant and the return flow of the condensed coolant, thereby expediting the cycling of the coolant. The result is that the transporting member is able to transport at a high speed, to the heat-dissipating portion, the heat that is produced by the electronic component.

In an electronic device according to a seventh aspect of the Present Disclosure, the heat transporting member has a first end portion that contacts thermally the heat-receiving member, and a second end portion, on the opposite side from the first end portion, that contacts thermally the heat-dissipating portion, where the sealed coolant is vaporized by the heat received by the heat-receiving portion, the vapor diffusing space causes the vaporized coolant to diffuse along a first direction, pores cause the coolant that condenses in the process of diffusing from the first end portion to the second end portion to move to the coolant return flow space, and the coolant return flow space causes the condensed coolant, that has moved to the coolant return flow space, to flow back in a second direction. This structure makes it possible for the transporting member to cause the heat removed from the electronic component to be diffused, by the vaporized coolant, along a specific direction, and to cause the condensed coolant to move to the coolant return flow space part way through the vapor diffusing space. The result is the ability to prevent interference of the condensed coolant in relation to the diffusion of the vaporized coolant in the vapor diffusing space, enabling the transporting member to transport the heat in the specific direction at a high speed. Combining these together, the socket for the electronic component enables the heat of the electronic component to be transported efficiently to the heat-dissipating portion, so that the heat-dissipating portion can cool the electronic component efficiently.

In the electronic device according to an eighth aspect of the Present Disclosure, the thermal connecting portion, when the electrical connection is established in the electrical connecting portion, makes thermal a connection between the electronic component and the electronic device. This structure performs cooling together with the start of operation of the electronic component.

In an electronic device according to a ninth aspect of the Present Disclosure, a warning portion, for indicating the thermally connected state of the electronic component and the heat-dissipating portion, is also provided. This structure enables the user of the electronic device to be prompted to notice the state of heat production of the electronic component.

BRIEF DESCRIPTION OF THE FIGURES

The organization and manner of the structure and operation of the Present Disclosure, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Disclosure may be susceptible to embodiment in different forms, there is shown in the Figures, and will be described herein in detail, specific embodiments, with the understanding that the disclosure is to be considered an exemplification of the principles of the Present Disclosure, and is not intended to limit the Present Disclosure to that as illustrated.

In the embodiments illustrated in the Figures, representations of directions such as up, down, left, right, front and rear, used for explaining the structure and movement of the various elements of the Present Disclosure, are not absolute, but relative. These representations are appropriate when the elements are in the position shown in the Figures. If the description of the position of the elements changes, however, these representations are to be changed accordingly.

Additionally, in the Present Disclosure, a "heat pipe" refers to a device that achieves the function of cooling a heat-producing member through a medium, which is built into an interior space thereof, repetitively vaporizing by receiving heat from the heat-producing body and condensing through the cooling of the vaporized coolant. While the term "pipe" is included in "heat pipe," a "pipe" is not a necessary requirement, but rather is a general term for devices that are able to cool a heat-producing member through vaporization and condensation of a coolant.

Further, a "heat sink" in the Present Disclosure is a member that makes thermal contact with a heat-producing body or a heat pipe and dissipates conducted heat.

Figure 1:
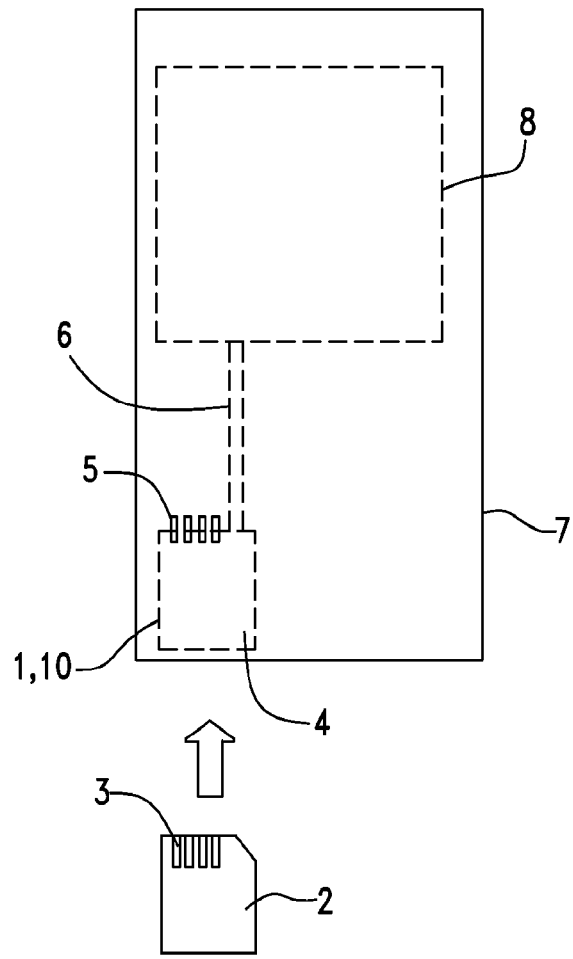
FIG. 1 is a front view of an electronic device having a socket for a card-shaped electronic component according to the Present Disclosure.
Figure 2:
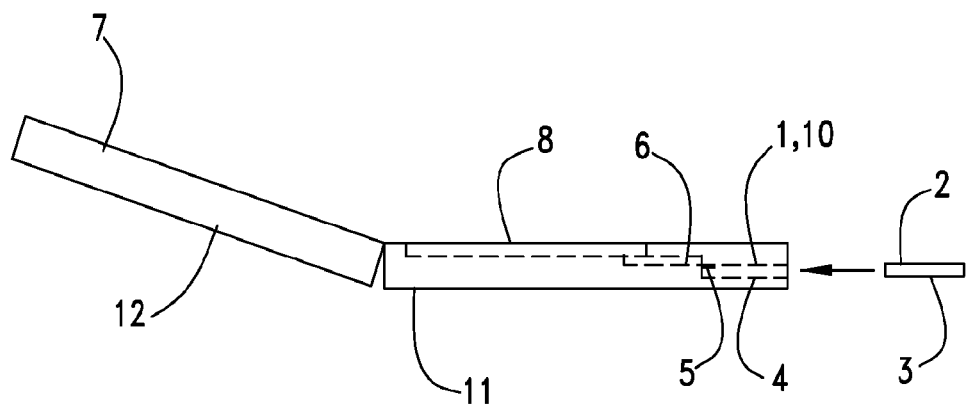
FIG. 2 is a side view of the electronic device of FIG. 1.

Referring to FIGS. 1-2, a first embodiment will be explained. In FIG. 1, the electronic device is provided with the electronic component socket internal thereto, where this electronic component socket is shown in a transparent state. Note that the electronic component socket 1 enables the installation and removal of a card-shaped electronic component. The electronic device 7 has electronic circuits and electronic circuit boards for achieving the functions thereof, mounted therein, and a heat-dissipating portion 8 is provided to dissipate the heat produced by these electronic circuits and electronic circuit boards. The heat-dissipating portion 8 is mounted in the electronic device 7, and the object thereof is to dissipate the heat from the electronic circuits and electronic circuit boards produced through the operation of the electronic device 7.

The electronic component socket 1 is able to accommodate, internally, an installable/removable electronic component 2. This electronic component socket 1 has a thermal connecting portion 6 for connecting thermally to the electronic component 2, where, when the electronic component 2 is operating, the electronic component 2 and the heat-dissipating portion 8 are connected thermally by the thermal connecting portion 6. In the electronic device 7, the electronic component 2 is installed from the outside into the interior of the electronic component socket 1, in order to exchange data signals with the electronic component 2. For example, an electronic component 2 having a function as a recording medium for recording electronic data is installed, and the electronic device 7 exchanges data signals with the electronic component 2. To this end, the electronic device 7 is provided with the electronic component socket 1 at a specific mounting location 10. In FIG. 1, the electronic component socket 1 is mounted at the mounting location 10, provided at the bottom portion of the electronic device 7. Additionally, the electronic device 7 has, in addition to the electronic component socket 1 and the heat-dissipating portion 8, a processing portion and a controlling portion (the electronic circuitry and software by which these are achieved) for providing the functions of the electronic device.

The electronic component socket 1 is provided with an interior space 4 wherein the electronic component 2 can be installed, an electrical connecting portion 5 for connecting electrically to the electronic component 2 and the electronic device 7, and a thermal connecting portion 6 for connecting thermally to the electronic component 2 and the heat-dissipating portion 8. Here the heat-dissipating portion 8 is provided at a location that is separate from that of the mounting location 10. Additionally, the thermal connecting portion 6 transports, to the heat-dissipating portion 8, the heat that is produced by the electronic component 2. The heat-dissipating portion 8 dissipates, to the outside, the heat that is produced by the electronic component 2, which has been transported by the thermal connecting portion 6. This dissipation prevents the heat generation by the electronic component 2 from exceeding a specific level, to prevent the malfunction of the electronic device 7 that would occur due to overheating of the electronic component 2, and malfunction due to overheating of the electronic component 2.

The electronic component 2 is installed in the electronic component socket 1, to establish securely the electrical connection with the electronic device 7, to enable the exchange of data signals with the electronic device 7. The electronic component 2 is provided with electrical terminals 3, where these electrical terminals 3 are connected electrically to the electronic circuits within the electronic component 2. When the electronic component 2 is installed in the electronic component socket 1, the electrical terminals 3 and the electrical connecting portion 5 make contact, to electrically connect the electrical terminals 3 and the electrical connecting portion 5. When electrically contacted, the electronic component 2 and the electronic device 7 are connected electrically through the electrical terminals 3 and the electrical connecting portion 5, and the electronic device 7 exchanges data signals with the electronic component 2.

The electronic component socket 1 in the first embodiment, based on the premise that an electronic component is to be installed in the interior space 4 thereof, is provided with two functions: (1) the establishment of an electrical connection between the electronic component 2 and the electronic device 7, and (2) the establishment of a thermal connection (and further, the transport of heat) between the electronic component 2 and the heat-dissipating portion 8 provided in the electronic device 7. The electronic device 7 is provided with the heat-dissipating portion 8 in order to dissipate the heat that is produced by the electronic circuits and electronic circuit boards that are provided therein. The electronic component socket 1 in the first form of embodiment uses this heat-dissipating portion 8 that is provided within the electronic device 7 to dissipate, to the outside, the heat produced by the electronic component 2.

The electronic device 7, in order to perform its various functions properly, must dissipate, through the heat-dissipating portion 8, the heat that is produced by, for example, the electronic circuitry, electronic circuit boards, power supplies, and the like, that are mounted therein. On the other hand, the electronic component 2 installed in the electronic component socket 1, with increases in the amount of data transferred and the speed of data transport, produces more heat as well. On the other hand, electronic components 2 have undergone rapid miniaturization, such as seen in various types of flash memories, and thus it is difficult to provide the heat-dissipating portion on the electronic component 2 or on the electronic component socket 1.

The electronic component socket 1 in the first form of embodiment focuses on this point, and thus has the function of transporting the heat produced by the electronic component 2 to the heat-dissipating portion 8 that is provided in the electronic device 7, to dissipate the heat that is produced by the electronic component 2. By the thermal connecting portion 6 transporting heat to the heat-dissipating portion 8, the thermal connecting portion 6 is able to transport the heat directly to the heat-dissipating portion 8, rather than passing through, for example, the frame of the electronic device 7. Because of this, the heat that is produced by the electronic component 2 is propagated efficiently to the heat-dissipating portion 8, and the heat is dissipated rapidly.

Referring to FIG. 2, the electronic device 7 is a mobile terminal provided with a first case 11 and a second case 12. The electronic device 7, as with the electronic device 7 in FIG. 1, is also provided with an electronic component socket 1 at a specific location 10 that is located in the vicinity of the bottom portion of the second case 12. The electronic component 2 is provided with electrical terminals 3, where the electronic component 2 is installed into the interior space 4 so that the electrical terminals 3 contact the electrical connecting portion 5 of the electronic component socket 1. That is, when the electronic component 2 is installed in the interior space 4, the electrical terminals 3 make electrical contact with the electrical connecting portion 5, to connect electrically the electronic component 2 and the electronic device 7. The result is that the electronic device 7 is able to exchange data signals with the electronic component 2.

Similarly, when the electronic component 2 is installed into the interior space 4 of the electronic component socket 1, the electronic component 2 contacts the thermal connecting portion 6 thermally. The electronic component 2 is able to contact not just the electrical terminals 3, but also the outer edges of the electronic component socket 1, for example, a metal seal, and the electronic component 2 and the thermal connecting portion 6 are connected thermally through this contact. The thermal connecting portion 6 is connected thermally to the heat-dissipating portion 8. The heat produced by the electronic component 2 is transported to the heat-dissipating portion 8 provided in the electronic device 7 through the thermal connecting portion 6 connecting the electronic component 2 and the heat-dissipating portion 8 thermally in this way. This transported heat is dissipated to the outside by the heat-dissipating portion 8.

In an electronic device 7, such as a mobile terminal provided with a first case 11 and a second case 12, often the electronic component 2, such as a memory card, is inserted from the bottom portion. Heat can be transported more easily upward than downward, and thus the thermal connecting portion 6 for connecting thermally to the electronic component 2 can transport easily the heat obtained from the electronic component 2 to the heat-dissipating portion 8. In this way, the electronic component socket 1, in addition to the electrical connecting portion 5 for achieving the electrical connections, is provided with a thermal connecting portion 6, and thus able to dissipate the heat produced by the installed electronic component 2 together with the heat produced by the other electronic circuitry and the like, provided in the electronic device 7.

In this way, the electronic component socket 1 not only enables the removable installation of the electronic component 2, but simultaneously achieves both electrical connections between the electronic component 2 and the electronic device 7 and thermal connections between the electronic component 2 and the heat-dissipating portion 8, thereby enabling the efficient dissipation of the heat from the electronic component 2 to the outside, through the heat-dissipating portion 8 that is provided in the electronic device 7. In particular, the electronic device 7 is provided with electronic circuits having many different functions and with an electronic circuit board for the high-density mounting thereof, and provided with a heat-dissipating portion 8 for dissipating the heat produced thereby. The heat-dissipating portion 8 usually has excellent heat-dissipating capability in order to dissipate the heat that is produced internally within this type of electronic device 7. That is, the heat-dissipating portion 8 has greater heat-dissipating capability than a heat-dissipating mechanism that can be mounted on the electronic component socket 1.

The electronic component socket 1 according to the first form of embodiment is able to dissipate the heat that is produced by the electronic component 2 that is installed in the electronic device 7 through the use of the high-heat-dissipating-capacity heat-dissipating portion 8 that is provided in the electronic device 7 in this way.

The electronic device 7 is able to receive the installation of the electronic component 2, to enable an expansion of functionality, to enable connections with other devices, and so forth. The electronic device 7 is actually able to exhibit the necessary functions as an independent device;

however, there is the need to read in video or audio data, or to output video or audio data. Because of this, an electronic component 2 for recording data, such as a memory card, is installed removably into the electronic device 7, to perform exchange of the video or audio data.

Conversely, the electronic device 7 may need to send recorded data to an external server, or to receive data from an external server. In such a case, the electronic component 2, having a wireless communication function or a wired communication function, may be installed removably in the electronic device 7.

In this way, the electronic device 7 in the first form of embodiment is provided with a mechanism for the removable installation of an electronic component or electronic device having a specific function.

As examples of electronic devices 7 provided with this type of mechanism, there are mobile telephones, mobile music playing devices, mobile mail terminals, PDAs, digital cameras, digital video cameras, mobile recorders, smart phones and mobile video projecting devices. Of course, these are merely examples of electronic devices 7, and other devices are included broadly as well.

Additionally, as illustrated in FIG. 2, the electronic device 7 may have a first case 11 and a second case 12. By providing a first case 11 and a second case 12 In this way, the electronic device 7 is provided with superiority in terms of ease of carrying, through being able to fold closed. This type of electronic device that has superiority in ease of carrying requires the ability to expand functionality after the fact, and thus has a mechanism for the removable installation of an electronic component 2 or electronic device. This structure is achieved through the electronic component socket 1.

Figure 11:
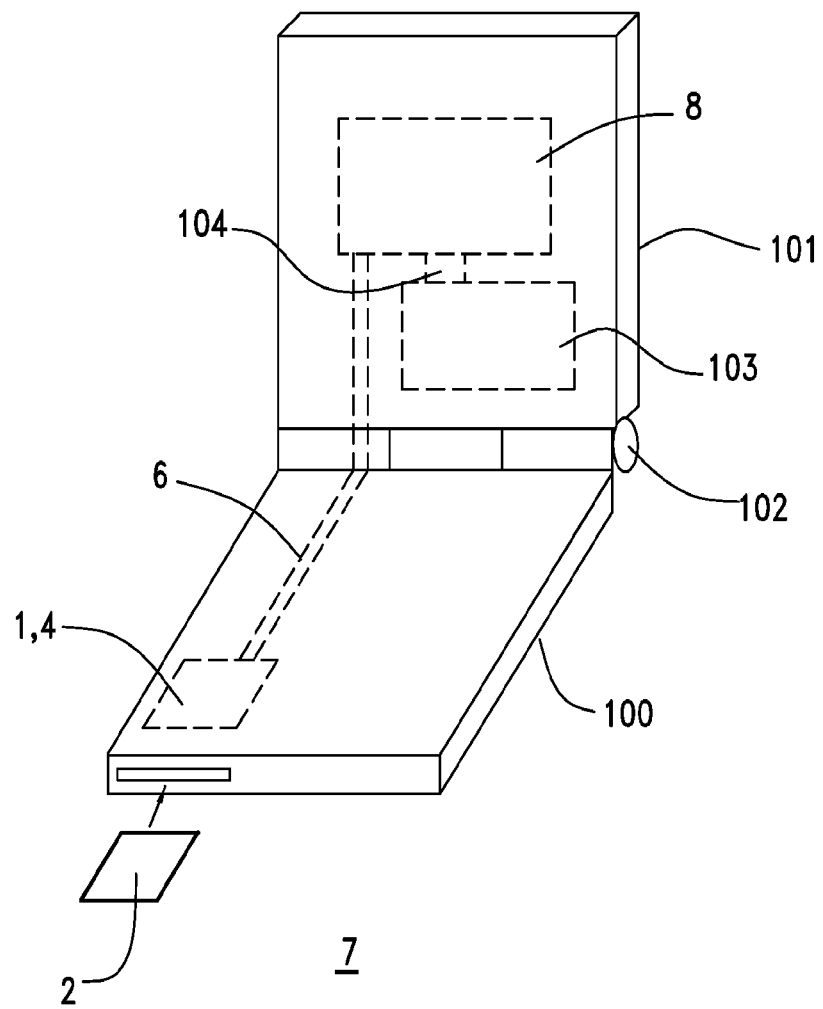
FIG. 11 is an oblique view of an electronic device of the Present Disclosure.

While omitted from the first form of embodiment, in the case wherein there is the first case and the second case, more preferably the first case 100 is provided with the electronic component socket 1 and the second case 101 is provided with the heat-dissipating portion 8, as illustrated in FIG. 11 (that which pertains to the fourth form of embodiment), described below. The reason why the electronic component socket 1 and the heat-dissipating portion 8 are provided in separate cases is to make it possible to separate the function of conducting the heat that is generated from the function of dissipating the heat that has been conducted, to thereby increase the efficiency of heat dissipation.

In this way, the electronic device 7, while having a variety of forms and a variety of functions, can have the functions thereof expanded through the use of installable electronic components 2.

The electronic component 2 is a component or device that is able to expand the functionality of the electronic device 7 through installation into the electronic device 7. For example, the electronic components 2 are, for example, flash memory cards for transporting data, card-shaped electronic components, IC tags, ID cards and ID tags and the like. Conversely, it may be a data transporting device for transporting data through wireless communications or wired communications, or a device able to expand functionality such as a camera, speaker, microphone or the like.

The electronic component 2 is small, and thus has a structure wherein a large number of circuits are mounted internally, and thus has a tendency to produce heat. In particular, when the electronic component 2 is a medium that functions as storage for recording data, or when the electronic component 2 has an antenna circuit, it is necessary to perform reading/writing of data to NAND or NOR memory, and to perform signal conversion, and thus a great amount of heat is produced in the transport of large amounts of data at high speeds between the electronic component 2 and the electronic device 7.

The electronic component 2 is installed in the electronic component socket 1. Specifically, the electronic component 2 is inserted into the interior space 4 of the electronic component socket 1.

Figure 3:
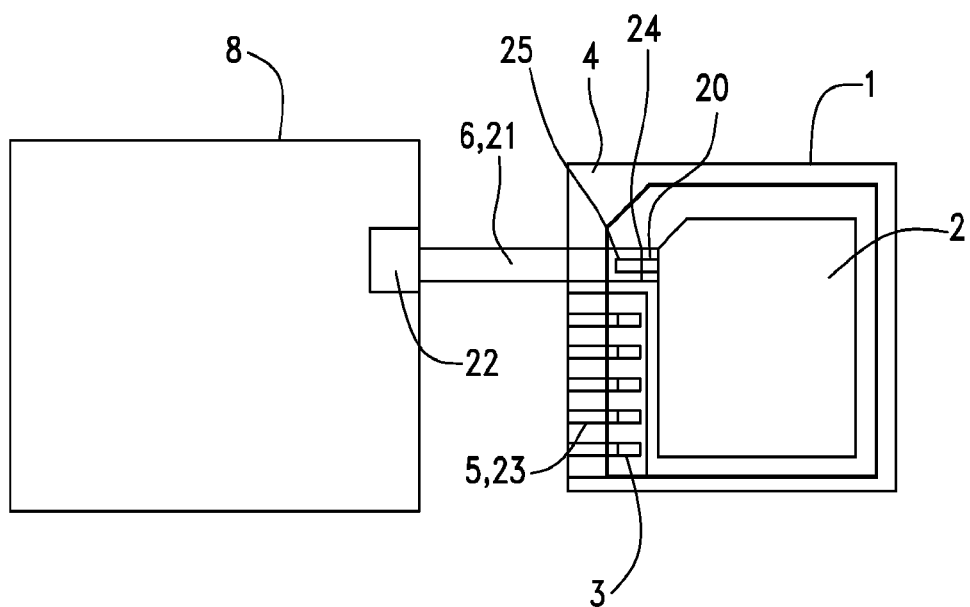
FIG. 3 is a structural diagram regarding the connections of the socket of FIG. 1.

The structure of the electronic component 2 will be explained using FIG. 3. FIG. 3 is a structural diagram of the heat-dissipating portion and the electronic component socket in the first form of embodiment according to the Present Disclosure. The electronic component 2 has electrical terminals 3 at an end portion of the electronic component 2, for transporting data. These electrical terminals 3 are contact points for the exchange of electrical signals. The electrical terminals 3 are connected electrically with electronic circuitry in the electronic component 2, and output electrical signals from the electronic circuitry through the electrical connecting portion 5 to the electronic device 7. Conversely, the electrical terminals 3 input electrical signals from the electronic device 7 through the electrical connecting portion 5 to the electronic circuitry within the electronic component 2. In this way, the electronic component 2 is provided with electrical terminals 3 used in the exchange of electrical signals between the electronic component 2 and the electronic device 7. The electrical terminals 3 are usually provided at an end portion of the electronic component 2, based on the structure for the installation into the electronic component socket 1; however, they may instead be provided near the center portion of the front surface or the back surface of the electronic component 2.

The electrical terminals 3 connect electrically to the electrical connecting portion 5 that is provided in the electronic component socket 1. More specifically, the electrical connecting portion 5 is provided with electrical pads 23 that have electrical conductivity, and the electrical terminals 3 connect to these electrical pads 23. These connections make it possible for the electronic component 2 and the electronic device 7 to exchange electrical signals.

On the other hand, in the electronic component 2, the heat that is produced therein is propagated to the thermal connecting portion 6 that is provided in the electronic component socket 1. The contact between the outer edge of the electronic component 2 and the thermal connecting portion 6 enables the electronic component 2 to conduct the heat to the thermal connecting portion 6. Note that the electronic component 2 preferably is provided with thermal terminals 24 in parallel with the electrical terminals 3. The thermal terminals 24 connect thermally with the thermal connecting portion 6, to cause conduction of the heat of the electronic component 2 to the thermal connecting portion 6.

The electronic component socket 1 is provided with an interior space 4 wherein the electronic component 2 can be installed removably. The interior space 4 has a shape and size in accordance with the shape and size of the electronic component 2. For example, if the electronic component 2 has an extremely thin flat plate shape, then it will have a matching shape with a thin thickness and a flat plate shape. This interior space 4 can receive the electronic component 2.

For example, if an electronic component socket 1 is provided in an end portion of the electronic device 7, then the interior space 4, illustrated in FIG. 2, will have the opening portion thereof visible on the end face of the electronic device 7. The electronic component 2 is inserted into the interior space 4 (that is, into the electronic component socket 1), and the electronic component 2 is removed from the interior space 4, through the opening portion that exists in the electronic device 7.

The interior space 4 preferably is also provided with a securing member for securing the electronic component 2 within the electronic component socket 1. The securing member may be provided with a hook portion for securing the electronic component 2 within the opening portion of the interior space 4, for example, and may use any of a variety of well-known securing means. Additionally, the positions of the electrical pads 23 are set within the interior space 4 so that the electrical terminals 3 that are provided on the electronic component 2 that is inserted into the interior space 4 will connect with the electrical pads 23. The position of the heat-receiving member for receiving the heat that is produced by the electronic component 2 is set similarly.

The electronic component socket 1 is provided with an electrical connecting portion 5 for connecting the electronic component 2 and the electronic device 7 electrically. The electrical connecting portion 5 is provided with, for example, electrical pads 23. The electronic component 2 is provided with electrical terminals 3 that are connected electrically to the internal circuitry of the electronic component 2, and the electrical pads 23 can connect electrically to the electrical terminals 3. As illustrated in FIG. 3, the electrical terminals 3 and the electrical pads 23 make contact when the electronic component 2 is inserted into the interior space 4. The electrical connections between the electronic component 2 and the electronic device 7 are established through this contact.

The electrical terminals 3 and the electrical pads 23 are connected electrically through the faces thereof contacting each other. The electrical pads 23 are connected electrically to the electronic circuitry within the electronic device 7, and thus the electronic device 7 and the electronic component 2 are able to exchange electrical signals through the electrical pads 23.

The electronic component 2 is provided with the electrical terminals 3; however, it is also provided with a region wherein there are no electrical terminals 3. Thermal terminals 24 are provided in this region. These thermal terminals 24 connected thermally to the thermal connecting portion 6, to transport the heat that is produced by the electronic component 2 to the heat-dissipating portion 8.

The thermal connecting portion 6 connects the electronic component 2 and the heat-dissipating portion 8 thermally, to transport, to the heat-dissipating portion 8, the heat that is produced by the electronic component 2. As illustrated in FIG. 3, the thermal connecting portion 6 transports, to the heat-dissipating portion 8 (where the heat-dissipating portion 8 is provided in the electronic device 7) which is provided at a location that is separate from that of the electronic component socket 1, the heat that is produced by the electronic component 2 that is installed in the electronic component socket 1. The electronic component 2 and the heat-dissipating portion 8 are connected thermally by this thermal connecting portion 6, so that the heat of the electronic component 2 is dissipated to the outside through the heat-dissipating portion 8.

The thermal connecting portion 6 has a heat-receiving member 20 for receiving the heat that is produced by the electronic component 2 and a transporting member 21 for transporting, to the heat-dissipating portion 8, the heat received by the heat-receiving member 20. The heat-receiving member 20 and the transporting member 21 need not be understood to be separate units, but rather the thermal connecting portion 6 may have two functions: a function for receiving the heat produced by the electronic component 2 and a function for transporting the heat that has been received.

Of course, as illustrated in FIG. 3, the thermal connecting portion 6 may have a structure wherein the heat-receiving member 20 that receives the heat from the electronic component 2 and the transporting member 21 that transports this heat can be understood as separate units. Moreover, the heat-receiving member 20 may be provided as a specific member, or the portion wherein the thermal connecting portion 6 contacts the electronic component 2 may be understood as the heat-receiving member 20.

Figure 4:
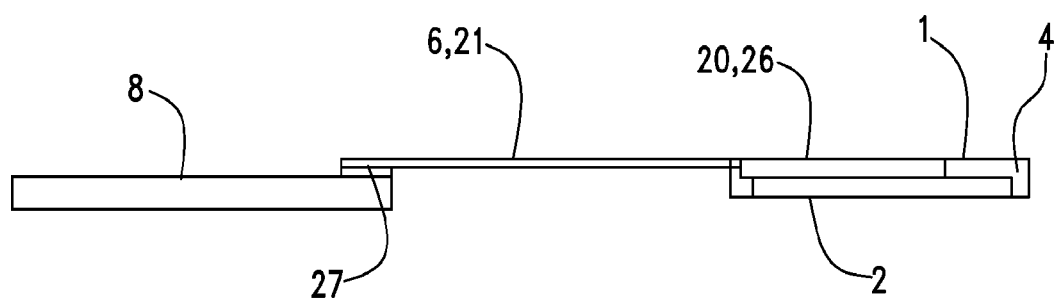
FIG. 4 is a bottom view showing, from the bottom face, the electronic device of FIG. 1.
Figure 5:
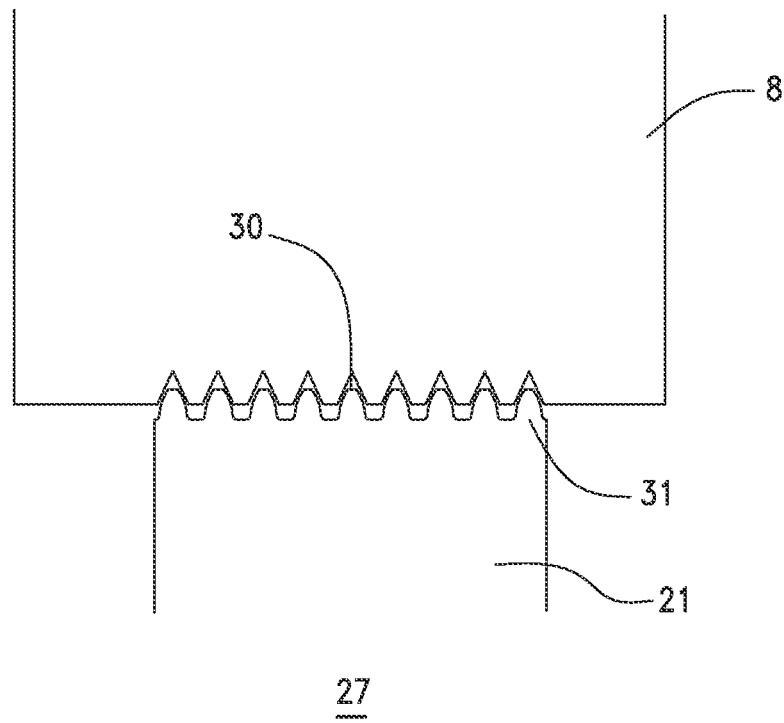
FIG. 5 is a structural diagram illustrating the contact between the transporting member and the heat-dissipating portion of the electronic device of FIG. 1.

The heat-receiving member 20 is provided on an outer edge of the interior space 4, and includes a plate member 26 that can receive the heat from the electronic component 2 that is inserted into the interior space 4. FIG. 4 illustrates this plate member 26. FIG. 4 is a side view diagram of the electronic component socket and the heat-dissipating portion in the first form of embodiment according to the Present Disclosure.

As illustrated in FIG. 4, the heat-receiving member 20 is provided with a plate member 26 that is provided at the outer edge of the interior space 4. This plate member 26 makes contact thermally with at least a portion of the front surface and/or the back surface of the electronic component 2. The plate member 26 receives heat from the electronic component 2 through this thermal contact. The heat that is received is conducted from the plate member 26 to the transporting member 21. Conversely, as illustrated in FIG. 3, the heat-receiving member 20 may be provided with thermally conducting pads 25 that contacts the thermal terminals 24.

The thermal terminals 24 are provided on an edge portion of the electronic component 2 in the same manner as the electrical terminals 3. These are not terminals for achieving electrical connections, but rather to make thermal contact with the heat-receiving member 20 when the electronic component 2 is installed. In this case, the heat-receiving member 20 is provided with a member that has a shape and size corresponding to that of the thermal terminals 24, rather than the plate member 26 as in FIG. 4. The thermally conducting pads 25 make thermal contact with the thermal terminals 24. The thermally conducting pads 25 make thermal contact with the thermal terminals 24, and thus should be provided matching the positions of the thermal terminals 24, for example, may be provided surrounding the electrical pads 23.

The heat-receiving member 20 may make thermal contact with the thermal terminals 24 and at least a portion of the front surface and/or the back surface of the electronic component 2, and may make contact thermally with both the thermal terminals 24 and the surface of the electronic component 2. Because of this, preferably the heat-receiving member 20 is provided with both the plate member 26 and the thermally conducting pads 25.

The heat-receiving member 20 conducts the heat to the transporting member 21. Because of this, it is necessary for the heat-receiving member 20 and the transporting member 21 to make thermal contact, for example, necessary for the plate member 26, the thermally conducting pads 25, and the transporting member 21 to be fabricated from a single member, or to be connected.

The transporting member 21 is able to transport, to the heat-dissipating portion 8, the heat received from the heat-receiving member 20, through making thermal contact with the heat-receiving member 20 in this way. The heat-dissipating portion 8 is a member having a heat-dissipating function, provided in the electronic device 7, and is separate from the mounting location of the electronic component socket 1. The transporting member 21 transports the heat to the heat-dissipating portion 8 that is separate from the mounting location of the electronic component socket 1. The transporting member 21 may be connected to the heat-dissipating portion 8 through a contacting member 27.

The transporting member 21 is provided with, for example, a heat diffusing member with excellent thermally conductivity made from, for example, metal, graphite, high-thermal-conductivity plastic (nylon, polyphenylene sulfide (PPS), epoxy resin or the like), or a compound material thereof, or, as described below, may be provided with a heat pipe. A variety of devices or apparatuses that have the function of being able to transport heat from end to end (which here is from the heat-receiving member 20 to the heat-dissipating portion 8) can be used as the transporting member 21.

In order for the transporting member 21 to transport the heat to the heat-dissipating portion 8, the transporting member 21 is connected thermally to the heat-dissipating portion 8. In order to achieve the thermal connection, the transporting member 21 is provided with a contacting member 27 at the position of contact with the heat-dissipating portion 8. For example, the contacting member 27 may be provided with a recessed portion or a hole that mates with a raised portion provided on the heat-dissipating portion 8. Conversely, the contacting member 27 may be provided with a raised portion that mates with a recessed portion or a hole that is provided in the heat-dissipating portion 8. Conversely, the contacting member 27 may be provided with a comb tooth-shaped member 31 that mates with a comb tooth-shaped member 30 that is provided on an end portion of the heat-dissipating portion 8. Mating the comb tooth-shaped member 31 with the comb tooth-shaped member 30 enables thermal contact between the transporting member 21 and the heat-dissipating portion 8.

Additionally, the contacting member 27 may be provided with a plate member that makes thermal contact with the surfaces of the transporting member 21 and the heat-dissipating portion 8. Of course, the contacting member 27 can be achieved through a combination of the raised portions, recessed portions, holes, comb tooth-shaped members 31, plate members and the like.

The transporting member 21 making thermal contact with the heat-dissipating portion 8 in this way enables the transported heat to be conducted to the heat-dissipating portion 8. In this way, the thermal connecting portion 6 is able to transport, to the heat-dissipating portion 8, the heat received from the electronic component 2 using the heat-receiving member 20 and the transporting member 21. That is, the insertion of the electronic component 2 into the interior space 4 causes the heat-receiving member 20 to make thermal contact with the electronic component 2, to receive the heat from the electronic component 2. The heat-receiving member 20 conducts the received heat to the transporting member 21. The transporting member 21 transports the conducted heat to the heat-dissipating portion 8. The contacting member 27 provided in the transporting member 21 connects the transporting member 21 and the heat-dissipating portion 8 thermally, and thus the heat that is transported by the transporting member 21 is conducted to the heat-dissipating portion 8. The heat-dissipating portion 8 dissipates this heat to the outside.

Note that while an electronic component 2 that is provided with thermal terminals 24 was explained herein, the structure may be one wherein the thermal connecting portion 6 contacts the outer edge of the electronic component 2 directly, without the provision of the thermal terminals 24. As described above, the heat of the electronic component 2 is dissipated to the outside through the heat-dissipating portion 8 that is provided in the electronic device 7, through the function of the thermal connecting portion 6, to thereby prevent malfunctions and the like, due to overheating of the electronic component 2.

The electronic device 7 is provided with a heat-dissipating portion 8 for dissipating the heat from the electronic circuitry and electronic components that are provided within the electronic device 7. The heat-dissipating portion 8 is usually provided in a location that is separate from the location wherein the electronic component socket 1 is provided. The thermal connecting portion 6 has the function of connecting thermally the electronic component socket 1 and the heat-dissipating portion 8 that is separate therefrom.

The heat-dissipating portion 8 is provided with a heat sink, a liquid-cooled jacket, a heat-dissipating plate, a graphite sheet and/or a cooling fan. Conversely, it may be provided with an element wherein the heat sink, liquid-cooled jacket, heat-dissipating plate, graphite sheet and cooling fan are combined appropriately.

The heat-dissipating portion 8, through the provision of the heat sink, liquid-cooled jacket, heat-dissipating plate, graphite sheet and/or cooling fan, or a combination thereof, is able to dissipate, to the outside, the heat of the electronic component 2 that is transported by the transporting member 21; however, there is no limitation to any of the forms of embodiment in the Present Disclosure insofar as it is a member that is provided with a heat-dissipating function.

Figure 6:
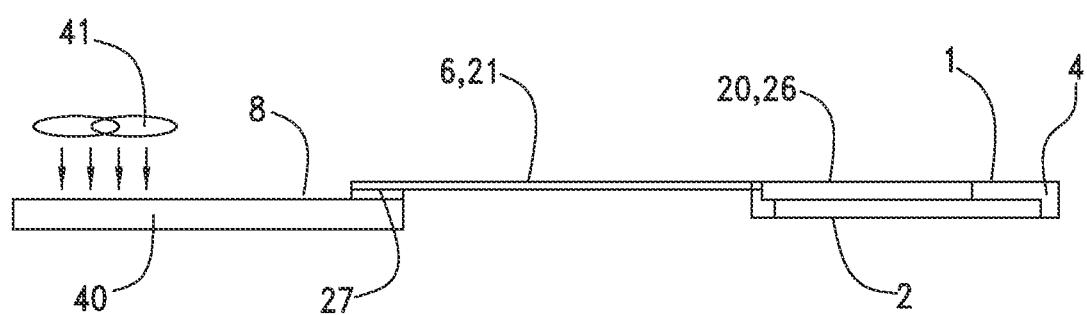
FIG. 6 is a side view of the heat-dissipating portion connected thermally to the electronic component socket of FIG. 1.

Here the electronic device 7 is required to be small and thin, and thus usually the heat-dissipating portion 8 is a heat-dissipating plate or a graphite sheet. Because of this, as illustrated in FIG. 6, the heat-dissipating portion 8 usually has a combination of a heat-dissipating plate 40 and a cooling fan 41 that blows air against the heat-dissipating plate 40. Having this type of combination enables the heat-dissipating portion 8 to dissipate heat efficiently to the outside.

As described above, the electronic component socket 1 in the first form of embodiment is provided with the thermal connecting portion 6 that connects the electronic component 2 and the heat-dissipating portion 8 thermally, in addition to the electrical connecting portion 5 that establishes the electrical connections between the electronic component 2 and the electronic device 7, thereby enabling the electronic component 2 to be cooled through the use of the heat-dissipating portion 8 that is provided in a location that is separate from the mounting location of the electronic component socket 1. Note that the thermal connecting portion 6 has a structure that establishes the thermal connection between the electronic component 2 and the heat-dissipating portion 8 when the electrical connections are established between the electronic component 2 and the electronic device 7 in the electrical connecting portion 5. As described above, the electronic component socket in the first form of embodiment is able to suppress overheating of the electronic component that is installed removably, through the use of the heat-dissipating portion that is provided in the electronic device.

In the second form of embodiment, a case will be described wherein the transporting member has a heat pipe structure for transporting efficiently the heat from an end portion to an end portion using a sealed coolant. A transporting member having the heat pipe structure that is the transporting member 21 explained in the first form of embodiment will be explained as the transporting member 51 in the second form of embodiment.

A heat pipe has a coolant sealed internally, and connects a surface that is a heat-receiving surface to a heat-producing body, such as an electronic component. The internal coolant is vaporized through the receipt of heat from the heat-producing body, and heat is removed from the heat-producing body at the time of vaporization. The vaporized coolant moves within the heat pipe. The heat from the heat-producing body is transported through this movement. The vaporized coolant that has moved is cooled at a heat-dissipating surface, or the like (or by a secondary cooling member such as a heat sink or a cooling fan), to be condensed. The coolant that has condensed into a liquid flows back within the heat pipe to move again to the heat-receiving surface. The coolant that has moved to the heat-receiving surface is vaporized again to remove the heat from the heat-producing body.

The heat-producing body is cooled by the heat pipe through the repetition of the vaporization and condensation of the coolant in this way. Because of this, preferably the heat pipe has, therein, a vapor diffusing space wherein the vaporized coolant diffuses, and a coolant return flow space wherein the condensed coolant flows back. A heat pipe that has this type of vapor diffusing space and coolant return flow space is able to transport, in a particular direction, the heat removed from the heat-producing body.

Figure 7:
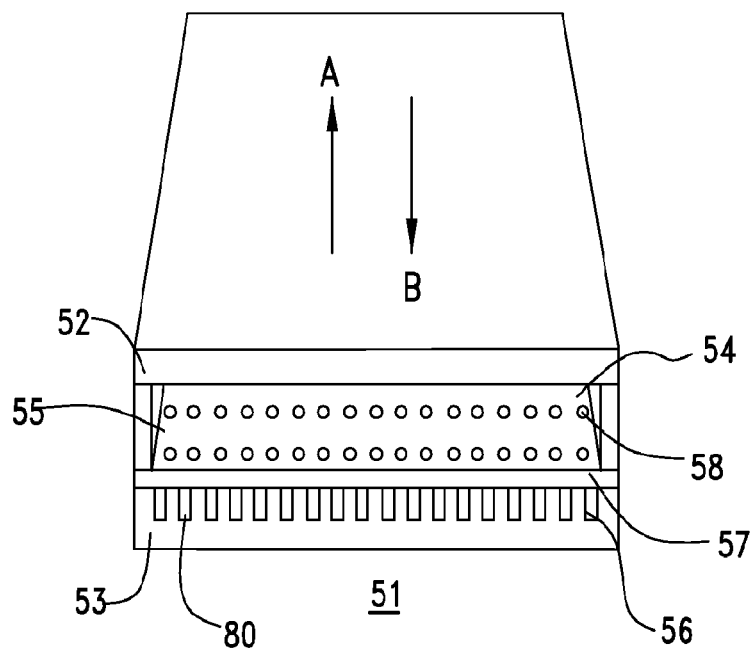
FIG. 7 is a perspective view of a transporting member of the Present Disclosure.
Figure 8:
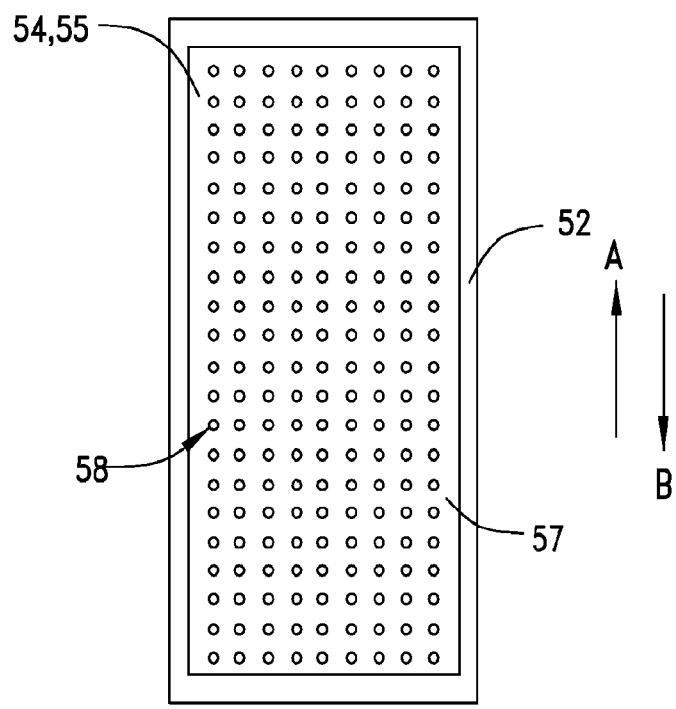
FIG. 8 is an interior face diagram of the transporting member of FIG. 7.
Figure 9:
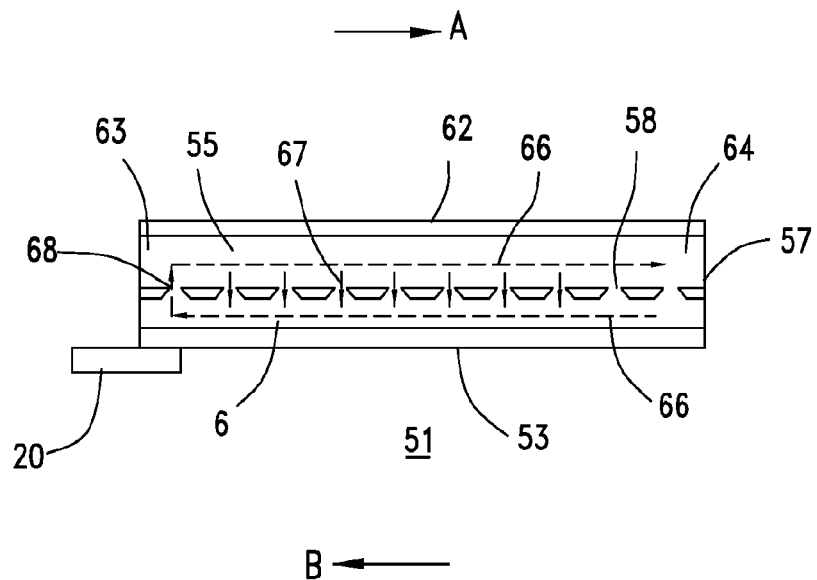
FIG. 9 is a side sectional diagram of the transporting member of FIG. 7.

Explaining in detail the structure illustrated in FIGS. 7-9, the transporting member 51 has a top plate 52, a bottom plate 53 that faces the top plate 52, and an interior space 54 that is formed by the top plate 52 and the bottom plate 53. The interior space 54 is filled with a coolant. In addition, the transporting member 51 is provided with a vapor diffusing space 55 and a coolant return flow space 56, included in the interior space 54. The vaporized coolant diffuses in the vapor diffusing space 55. The condensed coolant flows back in the coolant return flow space 56. Moreover, the transporting member 51 is provided with an interference-preventing plate 57 that prevents interference between the vaporized coolant that diffuses in the vapor diffusing space 55 and the condensed coolant that flows back in the coolant return flow space.

The interference-preventing plate 57 has a plurality of pores 58 for moving, into the coolant return flow space 56, coolant that has condensed within the vapor diffusing space 55. In the transporting member 51, first the interior space 54 is structured from the top plate 52 and the bottom plate 53. At this time, the end portions of the top plate 52 and the bottom plate 53 have a structure for sealing the interior space 54, so when the top plate 52 and the bottom plate 53 are brought together, forming the interior space 54, enclosed on the periphery. The interference-preventing plate 57 is layered between the top plate 52 and the bottom plate 53, so that the interference-preventing plate 57 is disposed within the interior space 54.

The coolant is filled within the interior space 54, and the vaporized coolant diffuses, and the condensed coolant flows back, and the interior space 54 is divided into a top plate 52 side and a bottom plate 53 side by the interference-preventing plate 57. The space on the top plate 52 side forms a vapor diffusing space 55 for diffusing the vaporized coolant, and the space on the bottom plate 53 side forms a coolant return flow space 56 that causes the condensed coolant to flow back. Note that the "top plate 52" and "bottom plate 53" are terms for convenience in differentiation, but they need not necessarily match up and down physically. Further, the vapor diffusing space 55 need not necessarily be physically at the top within the interior space 54, nor must the coolant return flow space 56 necessarily be physically at the bottom within the interior space 54. Additionally, the bottom plate 53 is provided with a groove 80 that extends in a specific direction, this groove 80 may also be formed on the top plate 52 as well. Moreover, there is no limitation to the groove 80, but rather a mesh or fine channels, or the like, may be provided, or any member that promotes the return flow of the coolant may be formed.

In this way, the interference-preventing plate 57 separates the interior space 54 into a vapor diffusing space 55 and a coolant return flow space 56. The result is that the coolant that is filled into the interior space 54, when it vaporizes to become vaporized coolant, diffuses in a specific direction (the direction of the arrow A in FIG. 7) within the vapor diffusing space 55, and when it condenses to become condensed coolant, it flows back in a specific direction (the direction of the arrow B in FIG. 7) in the coolant return flow space 56.

In the transporting member 51, the vaporized coolant diffuses in the direction of the arrow A using the vapor diffusing space 55, and the condensed coolant flows back in the direction of the arrow B using the coolant return flow space 56. The result is that the transporting member 51 is able to transport, rapidly and along the direction of the arrow A, heat from the heat-receiving member 20.

If the interior space 54 were not divided into the vapor diffusing space 55 and the coolant return flow space 56, the diffusion of the coolant that is vaporized by the heat from the heat-receiving member 20 and the return flow of the coolant condensed by cooling would interfere with each other. This interference would slow both the speed of diffusion of the vaporized coolant and the speed of return flow of the condensed coolant. If the diffusion speed and the return flow speed were slowed, then the speed of conduction of the heat removed from the heat-receiving member 20 would be slowed.

On the other hand, the transporting member 51 that is divided into the vapor diffusing space 55 and the coolant return flow space 56 by the interference-preventing plate 57 does not have interference between the diffusion of the vaporized coolant and the return flow of the condensed coolant, and thus the speed of diffusion and the speed of return flow are increased. As a result, the transporting member 51 can transport, at a high speed, the heat that is conducted from the heat-receiving member 20.

Additionally, the interference-preventing plate 57 has a plurality of pores 58. The pores 58 cause the condensed coolant to move from the vapor diffusing space 55 to the coolant return flow space 56 when the vaporized coolant that is diffusing within the vapor diffusing space 55 condenses. This movement causes the condensed coolant to arrive in the coolant return flow space 56, so that the condensed coolant flows back through the coolant return flow space 56. The vaporized coolant that diffuses through the vapor diffusing space 55 may condense at the end portion of the vapor diffusing space 55, due to the external environment of the transporting member 51, or may instead condense part way through. The interference-preventing plate 57 is provided with a plurality of pores 58, so that regardless of whether the coolant has condensed part way through the vapor diffusing space 55 or the coolant has condensed at the end portion thereof, the condensed coolant can be moved by the pores 58 from the vapor diffusing space 55 to the coolant return flow space 56.

The interference-preventing plate 57, as illustrated in FIG. 8, is provided with pores 58 across the entirety thereof. Of course, the provision across the entirety thereof is not an absolute requirement, but rather the pores 58 may instead be provided in only a portion of the interference-preventing plate 57. The pores 58 have the role of moving the condensed coolant, and thus the diameter may be of a size so as to apply a capillary force.

In the second form of embodiment, the transporting member 51 has a flat rectangular plate shape, and has a shape that is long in the direction of the arrow A. A heat-receiving member 20 is disposed at a first end portion 63 that is one end portion of the transporting member 51. The heat-receiving member 20 conducts heat to the one end portion 63. Note that while in FIG. 9 the heat-receiving member 20 contacts the bottom face of the bottom plate 53 at the first end portion 63, instead the heat-receiving member 20 may be connected integrally with the transporting member 51 at the one end portion 63 of the transporting member 51. The heat-receiving member 20 need not be a member that is especially distinguished from the transporting member 51, but rather may be a member that is integral therewith.

In the transporting member 51, a coolant is filled in advance into the interior space 54, and coolant that is in the liquid form at room temperature accumulates in the coolant return flow space 56. The bottom plate 53 obtains heat from the heat-receiving member 20. The coolant is vaporized by this heat, and the vaporized coolant passes through the pores 58 to move from the coolant return flow space 56 to the vapor diffusing space 55. This movement is indicated by the dotted arrows 68.

Following this, the vaporized coolant diffuses along the direction of the arrow A in the vapor diffusing space 55. The heat-receiving member 20 that is the heat source is located at the first end portion 63 of the transporting member 51, so the temperature of the first end portion 63 is higher. The vaporized coolant has a force that moves it from the high temperature position to the low temperature position, and thus the vaporized coolant diffuses along the direction of the arrow A. The dotted arrows 65 indicate the state of the diffusion of the vaporized coolant along the direction of the arrow A in the vapor diffusing space 55.

The vaporized coolant, while diffusing in the vapor diffusing space 55, is cooled by the effect of the external environment. Some or all of the vaporized coolant is condensed by this cooling. The vaporized coolant may condense part way through the vapor diffusing space 55, or may condense after arriving at the second end portion 64. Typically, one can consider the case of coolant that condenses part way through the vapor diffusing space 55 and the case of coolant that condenses after arriving at the second end portion 64.

The pores 58 are provided in the interference-preventing plate 57 corresponding to the entirety of the vapor diffusing space 55. Because of this, the coolant that has condensed part way through the vapor diffusing space 55 moves into the coolant return flow space 56 through the pores 58 that are provided part way through the vapor diffusing space 55. Moreover, the coolant that condenses at the second end portion 64 of the vapor diffusing space 55 moves through the pores 58 provided in the vicinity of the second end portion 64 to the coolant return flow space 56. The dotted arrows 67 indicate the state of the movement of the condensed coolant through the pores 58 to the coolant return flow space 56.

The provision of pores 58 at a variety of positions within the vapor diffusing space 55 enables the movement of the condensed coolant into the coolant return flow space 56 through nearby pores 58. Because of this, there is essentially no accumulation of condensed coolant in the vapor diffusing space 55, so there is no impediment when the vaporized coolant diffuses within the vapor diffusing space 55. Because there is no impediment, the vapor diffusing space 55 can diffuse the vaporized coolant at a high speed in the direction of the arrow A.

The condensed coolant that has moved flows back along the direction of the arrow B in the coolant return flow space 56. This is because the gas pressure is increased, through the absorption of heat from the heat-receiving member 20 at the first end portion 63 wherein the heat-receiving member 20 is disposed, so the condensed coolant moves to the first end portion 63 wherein the gas pressure is reduced. The dotted arrow 66 indicates the return flow of the condensed coolant along the direction of the arrow B.

The condensed coolant that has flowed back along the direction of arrow B in the coolant return flow space 56 flows back to the first end portion 63. The condensed coolant that has flowed back to the first end portion 63 is vaporized again by the heat of the heat-receiving member 20, and passes through the pores 58 to move into the vapor diffusing space 55. The vaporized coolant that has moved into the vapor diffusing space 55 diffuses again along the direction of the arrow A.

Through iterating the diffusion of the vaporized coolant along the direction of the arrow A and the return flow of the condensed coolant along the direction of arrow B the transporting member 51 is able to transport, at a high speed, the heat removed from the heat-receiving member 20 along the direction of the arrow A. In particular, the vapor diffusing space 55 and the coolant return flow space 56 are separated by the interference-preventing plate 57, and there is no mutual interference between the diffusion of the vaporized coolant and the return flow of the condensed coolant through the pores 58. This non-interference increases the speed of the diffusion of the vaporized coolant and the speed of the return flow of the condensed coolant.

Given the above, the transporting member 51 in the second form of embodiment is able to transport the heat at a high speed in a specific direction. Because of this, the thermal connecting portion 6, through the provision of the transporting member 51, is able to transport the heat produced by the electronic component 2 efficiently to the heat-dissipating portion 8.

An electronic component socket provided with a warning portion for detecting the status of thermal connection between the electronic component 2 and the heat-dissipating portion 8, and for issuing a warning based on the result of the detection, and an electronic device equipped therewith, will be explained in the third form of embodiment.

The electronic device 7, as explained in the first form of embodiment, is provided with a heat-dissipating portion 8 for dissipating the heat produced by the electronic circuitry and electronic circuit boards provided therein. Additionally, the electronic device 7 is provided with an electronic component socket 1 wherein an electronic component 2, having a specific function, can be installed from the outside, so as to expand the functionality, such as data communications. The electronic component socket 1 is provided with an interior space 4 wherein the electronic component 2 can be installed removably, an electrical connecting portion 5 for establishing the electrical connections between the electronic component 2 and the electronic device 7, and a thermal connecting portion 6 for connecting thermally between the electronic component 2 and the heat-dissipating portion 8.

The electronic component 2 is provided with electrical terminals 3 on at least a portion of the end portion, the front surface, and/or the back surface. The electrical terminals 3 connect the electronic component 2 and the electronic device 7 electrically through making electrical contact with the electrical connecting portion 5.

The electronic component 2 is provided with a conducting portion for conducting heat at a portion other than the electrical terminals 3, wherein this conducting portion makes thermal contact with a heat-receiving member 20 that is provided in the thermal connecting portion 6. The electronic component 2 is connected thermally to the thermal connecting portion 6 through this thermal contact. The result is that the electronic component 2 is connected thermally to the heat-dissipating portion 8. The electronic component 2 achieves thermal connections, through thermal contact with the heat-receiving member 20, when the electrical terminals 3 contact the electrical connecting portion 5 electrically.

The electronic device 7 achieves a thermal connection in addition to an electrical connection when the electronic component 2 is installed in the electronic component socket 1, so that the heat from the electronic component 2 is dissipated through the heat-dissipating portion 8. However, cases occur wherein the thermal connection between the electronic component 2 and the heat-dissipating portion 8 is inadequate due to some sort of problem, for example, due to a contact failure or due to a problem with the shape of the electronic component.

The electronic device 7 is envisioned as one wherein the heat that is produced in the electronic component 2 can be dissipated through the heat-dissipating portion 8. It is under this assumption that the electronic device 7 exchanges data at high transport speeds and transport quantities with the electronic component 2. At this time, the heat that is produced by the electronic component 2 can cause malfunctions if not dissipated from the heat-dissipating portion 8. Because of this, the electronic component socket 1 and the electronic device 7 wherein it is mounted preferably detect the state of thermal contact and issued a warning when necessary.

Figure 10:
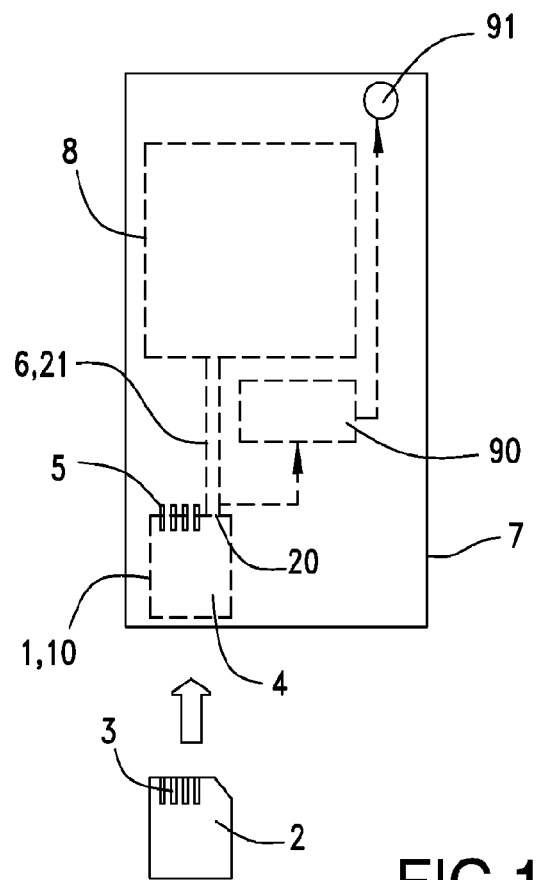
FIG. 10 is a structural diagram of an electronic device provided with the socket for an electronic component of the Present Disclosure.

The electronic component socket 1 illustrated in FIG. 10 detects the state of thermal connection between the electronic component 2 and the thermal connecting portion 6 (the heat-dissipating portion 8) in the thermal connecting portion 6. For example, the temperatures are detected for the electronic component 2 and the thermal connecting portion 6, and if the temperature difference between the two is greater than a specific value, then it is concluded that the thermal connection is inadequate. Because of this, preferably temperature sensors (not shown) for measuring the respective temperatures of the electronic component 2 and the thermal connecting portion 6 are provided in the electronic component socket 1.

The electronic component socket 1 outputs the results of the temperature measurements to the controlling portion 90. The controlling portion 90 determines the state of the thermal connection between the electronic component 2 and the heat-dissipating portion 8 based on the measured temperature difference. As described above, the controlling portion 90 determines that the state of the thermal connection is bad if the temperature difference is above a specific value, and determines that the state of thermal connection is good if the temperature difference is less than a specific value. The controlling portion 90 outputs an electrical signal in accordance with the determination result to the warning portion 91.

The warning portion 91 is provided with, for example, light-emitting elements to provide notification of the warning to the user through illuminating the light-emitting elements in specific colors. For example, if the state of thermal connection is good, then the warning portion 91 may cause the light-emitting element to emit a blue light, but if there is a problem in the state of thermal connection, then the warning portion 91 may cause the light-emitting element to emit a red light. Conversely, the warning portion 91 may provide notification of the state of thermal connection through a sound or a vibration through some sort of software means.

The user, upon receipt of this warning, adjusts the data transport speed or quantity. This adjustment makes it possible to prevent overheating of the electronic component 2, and to prevent malfunction of the electronic device 7. Additionally, the controlling portion 90 works in cooperation with the processing portion of the electronic device 7. The controlling portion 90 controls the processing by the processing portion based on the measurement results for the temperature obtained from the electronic component socket 1.

The processing portion performs the major functions of the electronic device 7. For example, the processing portion performs data transport, video processing, audio processing, video display, audio playback, and the like. The functionality of the processing portion is expanded through the installation of the electronic component 2. For example, if the electronic component 2 is a medium whereon data is stored, then the processing portion will send data to the electronic component 2. If, at this point, the heat-dissipating portion 8 dissipates the heat of the electronic component 2, then the processing portion will be able to transfer a large amount of data at a high speed. In contrast, if the state of thermal connections between the electronic component 2 and the thermal connecting portion 6 is defective, then the heat-dissipating portion 8 will not be able to dissipate the heat of the electronic component 2. In this case, the processing portion must perform data transfer at a low speed with low volumes of data.

If the state of thermal connection between the electronic component 2 and the thermal connecting portion 6 is determined to be defective, the controlling portion 90 issues a command to the processing portion to reduce the processing speed and the amount of processing. Upon receipt of this command, the processing portion reduces the speed of processing and the amount of processing. This reduction prevents the electronic component 2 from overheating, which can prevent malfunctioning of the electronic device 7.

On the other hand, if the state of thermal connection between the electronic component 2 and the thermal connecting portion 6 is determined to be good, then the controlling portion 90 issues, to the processing portion, a command to increase the processing speed and the amount of processing. Upon receipt of this command, the processing portion increases the processing speed and the amount of processing. This increase enables the electronic device 7 to exhibit fully the performance capabilities thereof.

As described above, the electronic component socket 1 as set forth in the third form of embodiment, and the electronic device 7 provided therewith, are able to detect the state of thermal connection between the electronic component 2 and the heat-dissipating portion 8. Furthermore, the electronic component socket 1 and the electronic device 7 provided therewith are able to enhance usability and prevent malfunctioning based on the detection results.

The electronic device 7 illustrated in FIG. 11 is provided with a first case 100 and a second case 101. The first case 100 and the second case 101 are connected by a hinge 102 so as to be able to open and close, where the first case 100 and the second case 101 can be folded closed by causing the front surfaces of the first case 100 and the second case 101 to face each other. The electronic device 7 is a mobile telephone, mobile music playback device, mobile mail terminal, PDA, digital camera, digital video camera, mobile recorder, smart phone or mobile video projecting device that is able to close in this way.

The first case 100 is provided with an electronic component socket 1 explained in the first through third forms of embodiment. In the electronic component socket 1, the electronic component 2 is installed removably in the interior space 4.

Additionally, the second case 101 is provided with a processing portion 103 for exchanging data with the installed electronic component 2. The processing portion 103 is provided with an electronic circuit, a semiconductor integrated circuit, an electronic circuit board, a processor, and the like, and may run a software program that is executed by the processor. The processing portion 103 executes not only the exchange of data with the electronic component 2, but also executes the functions of the electronic device 7. Note that the processing portion 103 may be mounted in the first case 100, rather than just the second case 101.

The second case 101 is provided with a heat-dissipating portion 8. The heat-dissipating portion 8 is provided in order to dissipate, to the outside, the heat that is produced by the electronic circuitry and electronic circuit boards that are mounted in the electronic device 7. The heat-dissipating portion 8 is provided with a heat sink, liquid-cooled jacket, a heat-dissipating plate, a graphite sheet, and/or a cooling fan. The heat-dissipating portion 8 dissipates heat produced in the process of the operation of the processing portion 103. Because of this, the processing portion 103 and the heat-dissipating portion 8 are connected by a thermally conducting portion 104. The thermally conducting portion 104 conducts, to the heat-dissipating portion 8, the heat produced by the processing portion 103. The heat that is conducted is dissipated to the outside by the heat-dissipating portion 8. Of course, the heat of the processing portion 103 may be conducted to the heat-dissipating portion 8 through the processing portion 103 and the heat-dissipating portion 8 being in direct contact, rather than the heat of the processing portion 103 being conducted to the heat-dissipating portion 8 through the thermally conducting portion 104.

Furthermore, the electronic component socket 1 provided in the first case 100 is provided with an electrical connecting portion 5 for connecting the electronic component 2 and the electronic device 7 electrically, and a thermal connecting portion 6 for connecting the electronic component 2 and the electronic device 7 thermally. The thermal connecting portion 6 transports the heat produced by the electronic component 2 to the heat-dissipating portion 8. The heat produced by the electronic component 2 can also be dissipated to the outside by the heat-dissipating portion 8 through this transportation. The heat-dissipating portion 8 is able to dissipate the heat produced by the electronic component 2 in addition to the heat produced by the processing portion 103 provided in the electronic device 7.

In this way, the electronic device 7 in the fourth form of embodiment is able to dissipate the heat of the provided processing portion 103 and the heat produced by the installed electronic component 2. Moreover, in the case of an electronic device that can fold shut, the provision of the heat-dissipating portion 8 and the electronic component socket 1 in respectively separate cases makes it more difficult for the heat dissipated from the heat-dissipating portion 8 to reach the hand of the user that holds the first case 100, thereby increasing the usability.

While a preferred embodiment of the Present Disclosure is shown and described, it is envisioned that those skilled in the art may devise various modifications without departing from the spirit and scope of the foregoing Description and the appended Claims.

What is claimed is:

1. An electronic device, the electronic device comprising:
an electronic component socket, the electronic component socket accommodating an installable electronic component therein, the electronic component socket including a thermal connecting portion, the thermal connecting portion being connected thermally to the electronic component, the thermal connecting portion including a transporting member, the transporting member including an interior space, a vapor diffusing space, a coolant return flow space and an interference-preventing plate, a coolant being sealed within the interior space, the vapor diffusing space for diffusing vaporized coolant included within the interior space, condensed coolant flowing back to the coolant return flow space, the interference-preventing plate preventing interference between the vaporized coolant and the condensed coolant; and
a heat-dissipating portion.

2. The electronic device of claim 1, wherein, when the electronic component is operating, the electronic component and the heat-dissipating portion are connected thermally through the thermal connecting portion.

3. The electronic device of claim 2, wherein the thermal connecting portion further includes a heat-receiving member, the heat-receivinq member receiving heat produced by the electronic component.

4. The electronic device of claim 3, wherein the transporting member transports, to the heat-dissipating portion, heat received by the heat-receiving member.

5. The electronic device of claim 4, wherein the electronic component socket further includes an electrical pad, the electrical pad connecting electrically with a contact point provided at an end portion of the electronic component.

6. The electronic device of claim 5, wherein the heat-receiving member includes a thermally conducting pad, the thermally conducting pad being isolated from the electrical pad.

7. The electronic device of claim 6, wherein the transporting member further includes a recessed portion, the recessed portion mating with a raised portion, the raised portion being provided on the heat-dissipating portion.

8. The electronic device of claim 7, wherein the transporting member further includes a raised portion, the raised portion mating with a recessed portion, the recessed portion being provided in the heat-dissipating portion.

9. The electronic device of claim 8, wherein the transporting member further includes a first comb tooth-shaped member, the first comb tooth-shaped member mating with a second comb tooth-shaped member, the second comb tooth-shaped member being provided in the heat-dissipating portion.

10. The electronic device of claim 9, wherein the heat-receiving member receives heat from the electronic component upon insertion of the electronic component into the electronic component socket.

11. The electronic device of claim 10, wherein the transporting member transports heat from the heat-receiving member to the heat-dissipating portion so that the thermal connecting portion transports, to the heat-dissipating portion, heat produced by the electronic component inserted into an interior space of the socket.

12. The electronic device of claim 11, wherein the transporting member further includes a first end portion, the first end portion thermally contacting the heat-receiving member.

13. The electronic device of claim 12, wherein the transporting member further includes a second end portion, the second end portion being disposed opposite the first end portion, the second end portion thermally contacting the heat-dissipating portion.

14. The electronic device of claim 13, wherein the sealed coolant is vaporized by heat received from the heat-receiving member.

15. The electronic device of claim 14, wherein the vapor diffusing space causes the vaporized coolant to diffuse along a first direction.

16. The electronic device of claim 15, wherein pores cause the coolant, condensed in the process of diffusing from the first end portion to the second end portion, to move into the coolant return flow space.

17. The electronic device of claim 16, wherein the coolant return flow space causes the condensed coolant, moved to the coolant return flow space, to flow back along a second direction.

18. The electronic device of claim 17, wherein, upon establishment of an electrical connection in the electrical connecting portion, the thermal connecting portion thermally connects the electronic component and the electronic device.

19. The electronic device of claim 18, further comprising a warning portion, the warning portion indicating the state of thermal connection between the electronic component and the electronic device.

* * * * *